(12) United States Patent
Utsunomiya et al.

(10) Patent No.: US 8,614,546 B2
(45) Date of Patent: Dec. 24, 2013

(54) ELECTROLUMINESCENCE APPARATUS, METHOD FOR MANUFACTURING ELECTROLUMINESCENCE APPARATUS, AND ELECTRONIC APPARATUS

(75) Inventors: Sumio Utsunomiya, Matsumoto (JP); Daisuke Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 608 days.

(21) Appl. No.: 12/619,066

(22) Filed: Nov. 16, 2009

(65) Prior Publication Data

US 2010/0156273 A1 Jun. 24, 2010

(30) Foreign Application Priority Data

Dec. 24, 2008 (JP) .................. 2008-327071

(51) Int. Cl.
*H01L 29/41* (2006.01)
*H01L 29/40* (2006.01)

(52) U.S. Cl.
USPC .......................................... 313/506; 313/505

(58) Field of Classification Search
USPC ................................. 313/498–512
See application file for complete search history.

(56) References Cited

U.S. PATENT DOCUMENTS

| | | | | |
|---|---|---|---|---|
| 6,621,213 | B2 * | 9/2003 | Kawashima | .................. 313/506 |
| 7,495,389 | B2 | 2/2009 | Noguchi et al. | |
| 8,093,805 | B2 | 1/2012 | Sakamoto et al. | |
| 2007/0041664 | A1 | 2/2007 | Yamada | |
| 2007/0228937 | A1 | 10/2007 | Akiyoshi | |
| 2007/0273305 | A1 | 11/2007 | Kubota | |
| 2009/0066236 | A1 * | 3/2009 | Sung et al. | ..................... 313/504 |

FOREIGN PATENT DOCUMENTS

| | | |
|---|---|---|
| CN | 101076842 A | 11/2007 |
| JP | A-2006-059796 | 3/2006 |
| JP | A-2006-331920 | 12/2006 |
| JP | A-2007-265756 | 10/2007 |
| JP | A-2007-287354 | 11/2007 |

\* cited by examiner

*Primary Examiner* — Karabi Guharay
*Assistant Examiner* — Nathaniel Lee
(74) *Attorney, Agent, or Firm* — Oliff & Berridge, PLC

(57) ABSTRACT

An electroluminescence apparatus includes: a plurality of electroluminescence elements each of which includes a first electrode, a second electrode that is provided opposite the first electrode, and a light-emitting function layer that is sandwiched between the first electrode and the second electrode and includes at least an electroluminescence material layer, the electroluminescence element emitting light produced in the electroluminescence material layer through the second electrode; a separation area; a display area and auxiliary wiring being electrically connected to the second electrode, the auxiliary wiring including first auxiliary wiring and second auxiliary wiring, wherein the first auxiliary wiring extends in the first direction without any break, and the second auxiliary wiring has a gap that is formed between the first auxiliary wiring and the second auxiliary wiring.

4 Claims, 12 Drawing Sheets

ELECTROLUMINESCENCE APPARATUS, METHOD FOR MANUFACTURING ELECTROLUMINESCENCE APPARATUS, AND ELECTRONIC APPARATUS

BACKGROUND

1. Technical Field

The present invention relates to an electroluminescence apparatus, a method for manufacturing an electroluminescence apparatus, and an electronic apparatus.

2. Related Art

Recently, as a display device used for a display unit of various electronic apparatuses such as mobile phones, the practical application of an electroluminescence (EL) apparatus has been advancing. The EL apparatus is provided with a plurality of EL elements arranged regularly in a display area. The EL apparatus forms an image by causing the EL elements to emit light. The EL element is made up of a pair of electrodes and a light-emitting function layer that is sandwiched between the pair of electrodes. One of the pair of electrodes is a anode (i.e., pixel electrode), which is formed over an element substrate on which driving elements are formed. The other of the pair of electrodes is a negative electrode (i.e., common electrode), which is formed opposite the pixel electrodes. The light-emitting function layer includes at least an EL layer (EL material layer). These days, the use of an organic EL apparatus is increasing. The organic EL apparatus uses an organic EL material as its EL material. In addition, the use of a top-emission type organic EL apparatus is increasing. The top-emission type organic EL apparatus emits light from a negative-electrode side in order to improve luminance with effective use of emission light (luminescence).

One problem of a top-emission type organic EL apparatus is the resistance of a negative electrode (common electrode). The negative electrode is usually formed throughout an entire display area. In order to achieve both translucency and conductivity, the negative electrode is formed as a very thin metal layer that has a thickness of several nanometers (nm) to more than ten nanometers. Or, the negative electrode is made of a high resistance material such as ITO (indium oxide tin alloy) whose resistance is higher than that of metal. Accordingly, the negative electrode has a high surface resistance (sheet resistance). Therefore, the amount of supply of an electric current to organic EL elements decreases because of a voltage drop at and near the center of a display area. For this reason, display quality might deteriorate. In an effort to provide a solution to such a problem, the following method is disclosed in, for example, JP-A-2007-265756. A plurality of auxiliary lines (i.e., electric wiring) is formed on a counter-substrate-side surface of a partition wall. The counter-substrate-side surface is a surface that faces toward and is closer to a counter substrate. The partition wall separates a plurality of organic EL elements from one another. Each of the plurality of auxiliary lines is electrically connected to a negative electrode. The plurality of auxiliary lines extends in parallel with one another. The plurality of auxiliary lines is formed by means of a mask film deposition method. A mask that has gap opening is placed on a substrate to cover a surface of the substrate. Particles of a conductive material are discharged straight toward the substrate covered by the mask. The conductive material particles deposit at the gap opening of the mask. In this way, the auxiliary lines are formed. The layer thickness requirement of the auxiliary lines is less strict. That is, the requirement in terms of the dimension of the auxiliary wiring in the direction of a line normal to an element substrate is less severe. Therefore, it is possible to reduce the surface resistance described above, thereby alleviating the degradation of display quality.

However, the negative electrode with the auxiliary lines having the above features has a disadvantage in that the effect of actually reducing the surface resistance is not so great because the flowing direction of a cathode current is substantially limited to the extending direction described above. The reduction effect is increased if the auxiliary lines are formed in a grid pattern so that the auxiliary lines extend in two directions that are substantially perpendicular to each other, for example, the vertical direction and the horizontal direction. However, if the auxiliary lines are formed in such a grid pattern, a problem arises in that production cost increases because it is necessary to perform a mask film deposition step at least twice. In addition, if the auxiliary lines are formed in such a two-directional pattern, the coverage of a passivation film, which is formed on a counter-substrate-side surface of the cathode, deteriorates at an intersection, that is, at a point/region where the auxiliary lines intersect with each other. Because of the poorer coverage of the passivation film thereat, a problem arises in that reliability might decrease.

SUMMARY

In order to address the above-identified problems without any limitation thereto, the invention provides, as various aspects thereof, an electroluminescence apparatus, a method for manufacturing an electroluminescence apparatus, and an electronic apparatus having the following novel and inventive features.

Application Example 1

First Aspect

An electroluminescence apparatus includes a plurality of electroluminescence elements each of which includes a first electrode, a second electrode that is provided opposite the first electrode, and a light-emitting function layer that is sandwiched between the first electrode and the second electrode and includes at least an electroluminescence material layer, the electroluminescence element emitting light produced in the electroluminescence material layer through the second electrode; a separation area that separates the plurality of electroluminescence elements arranged next to one another; a display area in which the plurality of electroluminescence elements and the separation area are formed; and auxiliary wiring that is formed in the separation area, the auxiliary wiring being electrically connected to the second electrode, the auxiliary wiring including first auxiliary wiring that extends in a first direction and second auxiliary wiring that extends in a second direction, which is different from the first direction, wherein the first auxiliary wiring extends in the first direction without any break, and the second auxiliary wiring has a gap that is formed between the first auxiliary wiring and the second auxiliary wiring.

With the configuration of an electroluminescence apparatus according to the first aspect of the invention, a cathode current flows in two directions that are different from each other by means of auxiliary wiring formed through the execution of a mask film deposition step only once. Therefore, it is possible to effectively suppress degradation in display quality due to a voltage drop, which means that display quality improves. The term "separation area" means an area that separates the light-emitting areas of electroluminescence elements from one another. An area where a partition wall is formed and an area where a black matrix is formed are examples of the separation area. In some cases, because of dispersion in manufacturing, the auxiliary wiring that is supposed to be formed in the separation area and is electrically connected to the second electrode may be formed partially at the light-emitting area(s) of electroluminescence element(s). However, the above feature "auxiliary wiring that is formed in the separation area" encompasses auxiliary wiring that is formed at the light-emitting areas of the electroluminescence elements as long as the auxiliary wiring separates the light-emitting areas.

Application Example 2

In the configuration of an electroluminescence apparatus according to the first aspect of the invention, it is preferable that the first direction and the second direction should be substantially perpendicular (i.e., orthogonal) to each other.

The electroluminescence apparatus having the preferred configuration described above can further reduce the voltage drop. Therefore, it is possible to suppress degradation in display quality with greater effects, which means that display quality further improves.

Application Example 3

In the configuration of an electroluminescence apparatus according to the first aspect of the invention, it is preferable that the gap should include a first gap and a second gap formed in the display area; and dimension of the first gap should be different from dimension of the second gap.

The electroluminescence apparatus having the preferred configuration described above makes it possible to suppress degradation in display quality with greater effects, which means that display quality further improves.

Application Example 4

An Electronic Apparatus is provided with an electroluminescence apparatus according to the first aspect of the invention.

Since the electronic apparatus is provided with an electroluminescence apparatus according to the first aspect of the invention, the electronic apparatus achieves a reduction in a difference between display quality at the center part of a display screen and display quality at the peripheral part of the display screen. For example, a difference in luminance therebetween can be reduced.

Application Example 5

A method for manufacturing an electroluminescence apparatus is provided. The electroluminescence apparatus includes a plurality of electroluminescence elements each of which includes a first electrode formed over a substrate, a second electrode that is provided opposite the first electrode, and a light-emitting function layer that is sandwiched between the first electrode and the second electrode and includes at least an electroluminescence material layer, the electroluminescence element emitting light produced in the electroluminescence material layer through the second electrode, a separation area that separates the plurality of electroluminescence elements arranged next to one another, a display area in which the plurality of electroluminescence elements and the separation area are formed, and auxiliary wiring that is formed in the separation area, the auxiliary wiring being electrically connected to the second electrode.

The manufacturing method includes preparing a mask that has a first opening that extends in a first direction throughout an area corresponding to the display area and a second opening that extends in a second direction, which is different from the first direction, the mask having no area that is completely surrounded by the first opening and the second opening; covering the substrate with the mask in such a manner that both the first opening and the second opening are positioned inside the separation area; discharging conductive material particles straight toward the substrate that is covered by the mask so as to form the auxiliary wiring that is made of the conductive material particles at an area overlapping either the first opening or the second opening inside the separation area; and forming the second electrode in the entire display area either before the covering of the substrate with the mask or after the formation of the auxiliary wiring.

The manufacturing method described above makes it possible to form auxiliary wiring that extends in two directions different from each other through the execution of a mask film deposition step only once. Thus, it is possible to manufacture an electroluminescence apparatus that can display an image in high quality with effective reduction of a voltage drop at the time of display without increasing production cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

With reference to the accompanying drawings, an electroluminescence (EL) apparatus and a method for manufacturing an EL apparatus according to exemplary embodiments of the invention will now be explained in detail. The concept of the invention can be applied not only to a top-emission type EL apparatus that uses an organic EL material but also to a top-emission type EL apparatus that uses an inorganic EL material. In the following description of exemplary embodiments of the invention, an organic EL apparatus, which uses an organic EL material, is taken as an example. It should be noted that, in the accompanying drawings that are mentioned below, the dimensions and/or scales of constituent elements are modified from those that will be adopted in actual implementation of the invention for the purpose of making them easily recognizable in each illustration.

First Embodiment

Figure 1:
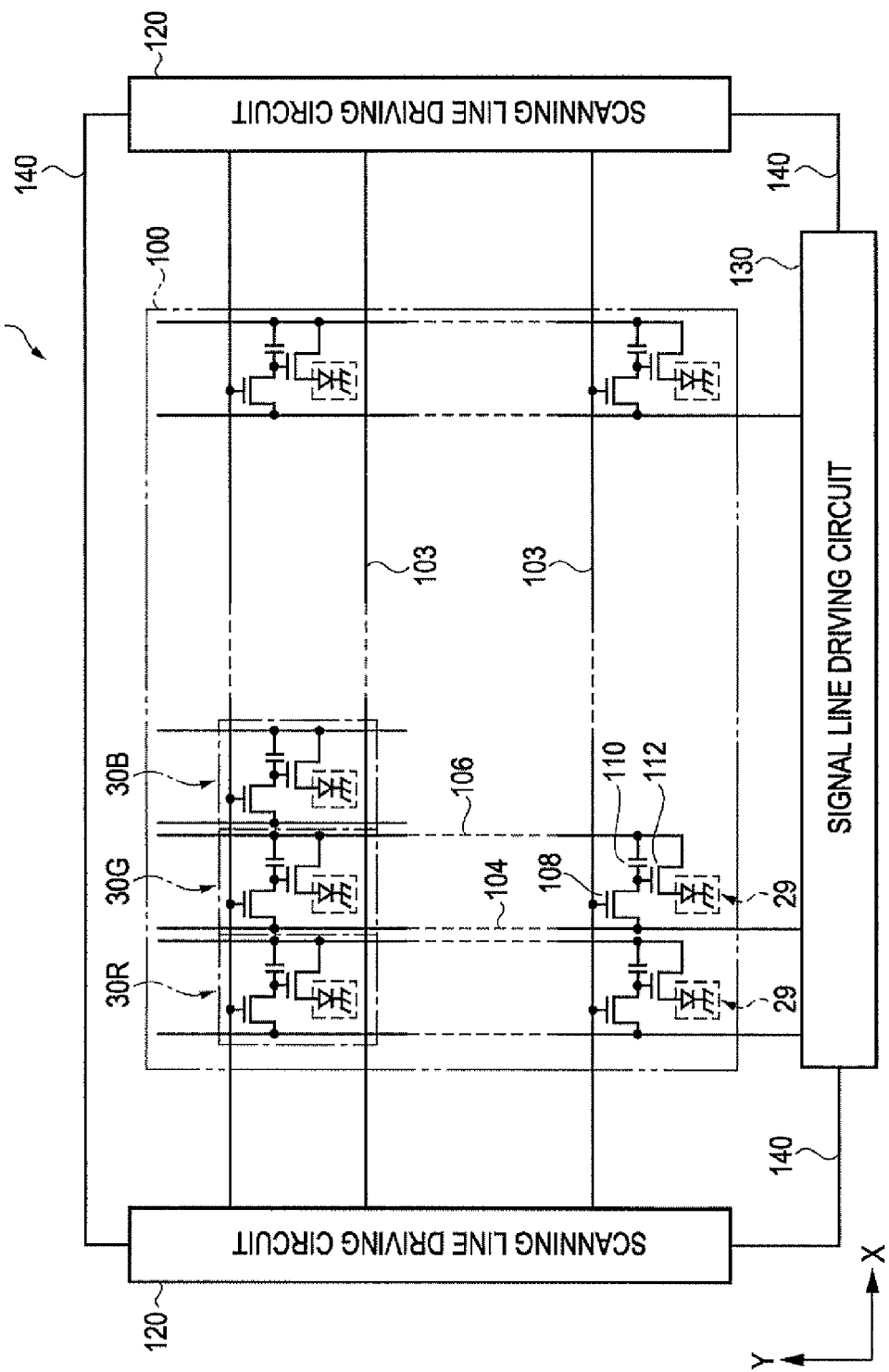
FIG. 1 is a circuit diagram that schematically illustrates an example of the overall configuration of an organic EL apparatus according to a first embodiment of the invention.

FIG. 1 is a circuit diagram that schematically illustrates an example of the overall configuration of an organic EL apparatus 1 according to a first embodiment of the invention. The organic EL apparatus 1 has a display area 100 and a peripheral area (no reference numeral is assigned thereto) that is formed around the display area 100. A plurality of scanning lines 103, a plurality of signal lines 104, and a plurality of power lines 106 are formed in the display area 100. The scanning lines 103 extend in the X direction. The signal lines 104 extend in the Y direction. The power lines 106 also extend in the Y direction. Three types of organic EL pixels 30, that is, red organic EL pixels 30R, green organic EL pixels 30G, and blue organic EL pixels 30B, are arranged regularly. Each one of the red organic EL pixels 30R, the green organic EL pixels 30G, and the blue organic EL pixels 30B is formed in a quadrangular compartmentalized area whose X-directional fringes are respectively defined by the signal line 104 and the power line 106 and Y-directional fringes by the scanning lines 103.

Each of reference alphabets that follow the reference numeral 30 of the organic EL pixels corresponds to the color of a color filter 75 (refer to FIG. 3) for the organic EL pixel. The reference alphabet represents the color of light emitted from a light-emitting area 101 (refer to FIG. 2) corresponding to each organic EL pixel 30. In the following description, the organic EL pixels are collectively denoted as 30 when the color difference is not taken into consideration. In like manner, the light-emitting areas are collectively denoted as 101 when they are not differentiated from one another on the basis of colors.

The organic EL apparatus 1 is an active-matrix display device. Each organic EL pixel 30 includes a switching thin film transistor (TFT) 108, a hold capacitor 110, a driving TFT 112, and an organic EL element 29 (refer to FIG. 3). A scanning signal is supplied through the scanning line 103 to the gate electrode of the switching TFT 108. An image signal is supplied from the signal line 104 to the hold capacitor 110 via the switching TFT 108. The hold capacitor 110 retains the image signal supplied thereto. The pixel signal retained at the hold capacitor 110 is then supplied to the gate electrode of the driving TFT 112. A driving electric current flows from the power line 106 into the organic EL element 29 through the driving TFT 112. The organic EL pixel 30 is a functional concept that includes the constituent elements explained above. In contrast, each of the light-emitting area 101 (refer to FIG. 2) and a separation area 102 (refer to FIG. 2), which will be explained later, is a planar concept.

A scanning line driving circuit 120 and a signal line driving circuit 130 are provided in the peripheral area. The scanning line driving circuit 120 sequentially supplies scanning signals to the scanning lines 103 in accordance with various signals supplied from an external circuit. The external circuit is not illustrated in the drawing. The signal line driving circuit 130 supplies image signals to the signal lines 104. An external circuit that is not illustrated in the drawing supplies a pixel-driving current to the power lines 106. A synchronization signal is supplied to the scanning line driving circuit 120 and the signal line driving circuit 130 via a synchronization signal line 140. Accordingly, the scanning line driving circuit 120 and the signal line driving circuit 130 operate in synchronization with each other.

The switching TFT 108 turns ON when driven through the scanning line 103. The potential (i.e., voltage level) of the signal line 104 at the time when the switching TFT 108 turns ON is retained at the hold capacitor 110. The level of the driving TFT 112 is determined in accordance with the state of the hold capacitor 110. Then, a driving current flows from the power line 106 into a pixel electrode 25 (refer to FIG. 3), which is an example of a first electrode according to an aspect of the invention, through the driving TFT 112. The organic EL element 29 emits light in accordance with the level of the driving current. The light emitted is colored into one of the three primary colors by the color filter 75. The colored light exits from the light-emitting area 101 corresponding to the organic EL pixel 30.

Figure 2:
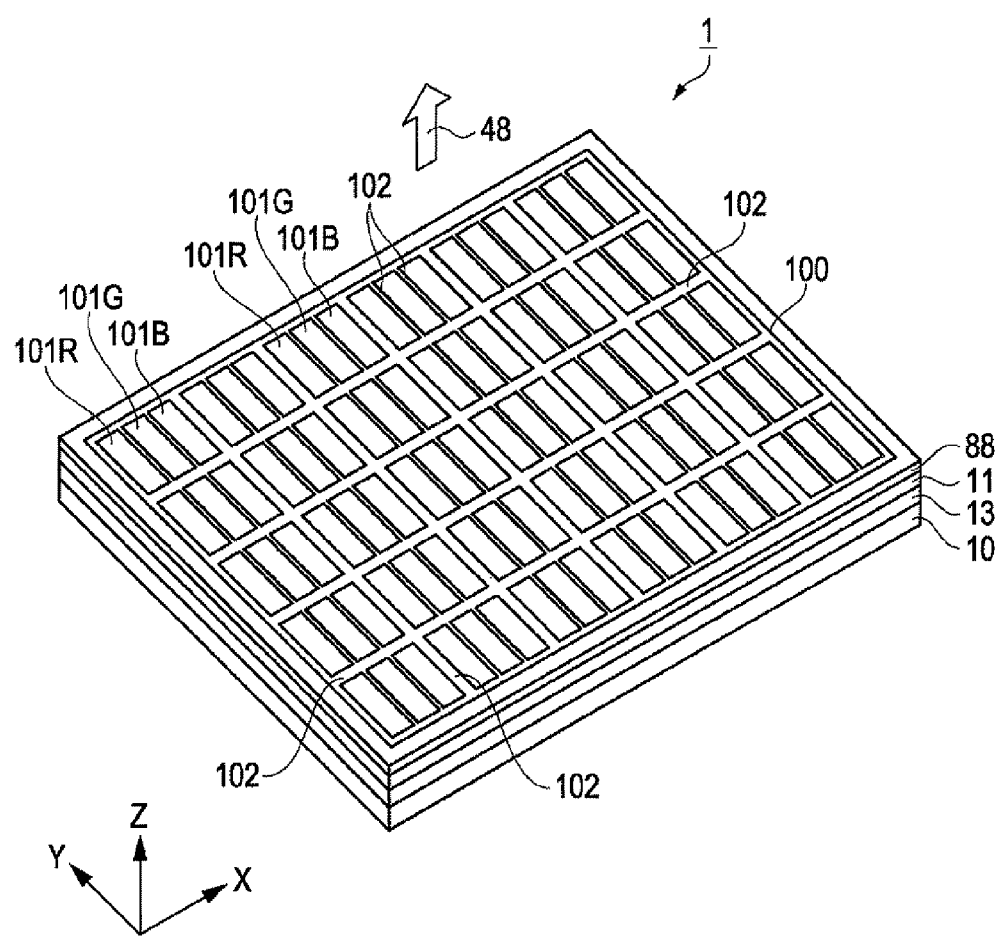
FIG. 2 is a perspective view that schematically illustrates an example of the rough structure of a organic EL apparatus according to the first embodiment of the invention.

FIG. 2 is a perspective view that schematically illustrates an example of the rough structure of the organic EL apparatus 1 according to the first embodiment of the invention. The organic EL apparatus 1 includes a peripheral sealant 13, an element substrate 10, and a counter substrate 11. The element substrate 10 and the counter substrate 11 are arrayed opposite each other and bonded to each other with an adhesive layer 78 (refer to FIG. 3) provided between the element substrate 10 and the counter substrate 11 as explained later. The organic EL elements 29 are formed inside the display area 100 over the element substrate 10. The organic EL elements 29 emit light when charged with electricity. The scanning line driving circuit 120 and the like are formed inside the peripheral area over the element substrate 10. On the other hand, the color filter 75 (refer to FIG. 3) and the like are formed on an element-substrate-side surface of the counter substrate 11. The element-substrate-side surface is the surface that faces toward the element substrate 10. A circular light polarization plate 88 is bonded to the other surface of the counter substrate 11.

As explained earlier, the organic EL apparatus 1 is a top-emission type organic EL apparatus. In the operation of the organic EL apparatus 1, a beam of light 48 produced in, and emitted from, the organic EL elements 29 due to the application of current propagates in a direction shown by arrows to pass through the color filter 75. That is, the emitted light 48 propagates toward the counter substrate 11. For this reason, the counter substrate 11 is made of a transparent material. On the other hand, the element substrate 10 does not necessarily have to be optically transmissive, though it must have insulating property. The circular light polarization plate 88 is a laminated body made up of a linear light polarization plate and a quarter wavelength correction plate (i.e., element that gives a phase difference of a quarter wavelength between two polarized components orthogonal to each other). The circular light polarization plate 88 is bonded to the other surface of the counter substrate 11 for the purpose of suppressing outside-light reflection by utilizing the nature of polarized light whose rotation direction is reversed when light is reflected, thereby enhancing display quality.

As illustrated in the drawings, three types of the light-emitting areas 101 each of which emits light of the corresponding one of the three primary colors are arranged regularly in the display area 100. That is, red light-emitting areas 101R from which red light is emitted, green light-emitting areas 101G from which green light is emitted, and blue light-emitting areas 101B from which blue light is emitted are arrayed in a regular pattern. The organic EL elements 29 of the organic EL apparatus 1 according to the present embodiment of the invention are common, in terms of color property, to these three types of the light-emitting areas 101. Accordingly, the color filter 75 is the determinant of the color of light explained above. Each light-emitting area 101 can emit light that has a given intensity as driven by a driving current that is supplied to the corresponding organic EL element 29. Therefore, each set of the three light-emitting areas (three types of the light-emitting areas) 101 can emit light of an arbitrary color. The set of the three light-emitting areas 101 is hereinafter referred to as a "unit".

The area between the light-emitting areas 101 (and between the red light-emitting area 101R, the green light-emitting area 101G, and the blue light-emitting area 101E), which are arranged next to one another, is the separation area 102. As will be further explained later, the separation area 102 is an area at which a black matrix 75K is formed in a plan view. The area at which the separation area 102 is formed roughly fits with the area at which the organic EL elements 29 are formed. The width of the separation area 102 is relatively large at each area between two units of the light-emitting areas 101 arranged next to each other. As defined earlier, each unit of the light-emitting area 101 is made up of one red light-emitting area 101R, one green light-emitting area 101G, and one blue light-emitting area 101B. The width of the separation area 102 is relatively small at each area between the red light-emitting area 101R and the green light-emitting area 101G arranged next to each other in the X direction in each unit of the light-emitting area 101. In like manner, the width of the separation area 102 is relatively small at each area between the green light-emitting area 101G and the blue light-emitting area 101E arranged next to each other in the X direction in each unit of the light-emitting area 101. In the structure of the organic EL apparatus 1 according to the present embodiment of the invention, auxiliary cathode wiring (e.g., auxiliary cathode wiring) is formed at each area between two units of the light-emitting areas 101 arranged next to each other where the width of the separation area 102 is relatively large. A more detailed explanation of the auxiliary cathode wiring will be given later.

Figure 3:
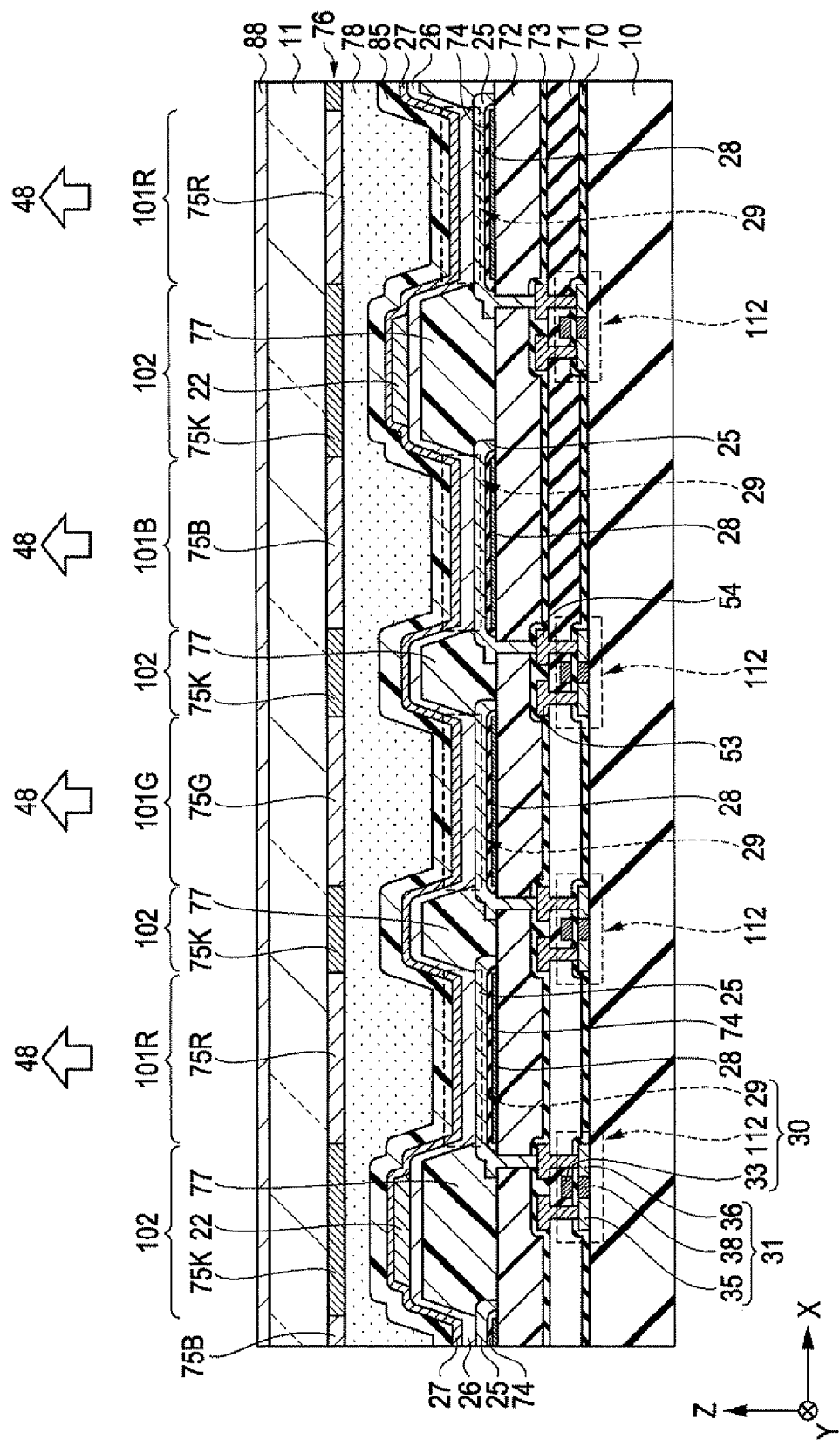
FIG. 3 is a sectional view that schematically illustrates an example of the layer structure of an organic EL apparatus according to the first embodiment of the invention.

FIG. 3 is a sectional view that schematically illustrates an example of the layer structure of an organic EL apparatus according to an exemplary embodiment of the invention. The organic EL apparatus 1 according to the present embodiment of the invention is characterized by auxiliary cathode wiring that is formed at the large-width part of the separation area 102, which demarcates the light-emitting areas 101 arranged next to one another for area separation. Accordingly, FIG. 3 shows the cross section of a partition wall ("partition walls" if viewed as individual walls) 77, which overlap the separation area 102 in a plan view, the cross section of auxiliary cathode wiring, which is formed over one surface of the partition wall facing toward and closer to the counter substrate 11 than the other opposite surface (a second auxiliary cathode wiring 22 is shown in FIG. 3), the cross section of the organic EL elements 29, which are formed at areas corresponding to the light-emitting areas 101, and the cross section of the driving TFTs 112, which drive the respective organic EL elements 29. The driving TFT 112 is hereinafter simply referred to as the TFT 112. The switching TFTs 108 and the hold capacitors 110 are omitted from the drawing. These layer components are explained below, starting from one that is closest to the element substrate 10 in the order of layer formation.

The TFT (TFTs) 112 is formed on the element substrate 10. A protection layer may be formed at a boundary surface between the element substrate 10 and the TFT 112. The TFT 112 includes a semiconductor layer 31, a gate electrode 33, a gate insulation layer 70, and the like. The gate electrode 33 is formed as a result of patterning a scanning-line layer, that is, the same layer as that of the scanning line 103. The gate insulation layer 70 is formed between the semiconductor layer 31 and the gate electrode 33. An area of the semiconductor layer 31 that overlaps the gate electrode 33 in a plan view constitutes a channel region 38. The channel region 38 is formed between a source region 35 and a drain region 36.

The gate electrode 33 has a layered structure that includes a Ti (titanium) layer, an AlCu (aluminum copper alloy) layer, and a TiN (titanium nitride) layer. These layers are laminated in the order of appearance herein viewed from the element substrate 10 in the upward direction. The source electrode 53 has a layered structure that includes a Ti layer, an AlCu layer, and a Ti layer. These layers are laminated in the order of appearance herein viewed from the element substrate 10 in the upward direction. The structure of the drain electrode 54 is the same as that of the source electrode 53.

An interlayer insulation layer (i.e., inter-bedded insulation layer) 71 that is made of silicon nitride or silicon oxide is formed over the counter-substrate-side surface of the TFTs 112. The counter-substrate-side surface is a surface that faces toward and is closer to the counter substrate 11. In the following description, the "counter-substrate-side (11) surface" may be simply referred to as the upper surface. A "counter-substrate-side (11) layer" may be simply referred to as an upper layer. A contact hole (no reference numeral is assigned thereto) is formed through the interlayer insulation layer 71 as a result of local etching of the interlayer insulation layer 71. The source region 35 is electrically connected to the source electrode 53 via the contact hole. In like manner, the drain region 36 is electrically connected to the drain electrode 54 via a contact hole (no reference numeral is assigned thereto) that is formed through the interlayer insulation layer 71 as a result of local etching of the interlayer insulation layer 71.

A first protection layer 73 that is made of silicon nitride and a planarization layer 72 are formed in this order over the source electrode 53 and the drain electrode 54 as the upper layer thereof. The thickness of the planarization layer 72 is approximately 2.0 µm. It is preferable that the planarization layer 72 should be made of an organic material such as acrylic resin or the like.

A reflection layer 28 is formed at predetermined areas over the planarization layer 72 as the upper layer thereof. The predetermined areas include organic-EL-formation areas where the organic EL elements 29 will be formed in a later layer-formation process. The reflection layer 28 has a function of reflecting light emitted by the organic EL element 29 toward upper layers. For this purpose, the reflection layer 28 is required to be formed at the areas including at least the organic-EL-formation areas where the organic EL elements 29 will be formed later. It is preferable that the reflection layer 28 should be made of a material that has high reflectivity and excellent workability ("patternability"). A preferred example of the material of the reflection layer 28 is Al (aluminum). A second protection layer 74 that is made of silicon nitride covers the upper surface of the reflection layer 28. The second protection layer 74 has a function of protecting the reflection layer 28 during the formation of the pixel electrode (anode) 25, which is formed as explained below as an example of the first electrode according to an aspect of the invention.

The pixel electrodes 25 are formed over the upper surface of the planarization layer 72. One pixel electrode 25 is provided for each TFT 112. The pixel electrode 25 is formed at an area including the formation area of the reflection layer 28. The pixel electrode 25 covers the reflection layer 28. The pixel electrode 25 must have a work function that is higher than that of a cathode (i.e., negative pole) 27. In addition, the pixel electrode 25 must be electrically conductive. The cathode 27 is an example of a second electrode according to an aspect of the invention. A more detailed explanation of the cathode 27 will be given later. In the structure of the organic EL apparatus 1 according to the present embodiment of the invention, the pixel electrode 25 is made of ITO (indium oxide tin alloy), which is a kind of a transparent conductive material. In a case where the pixel electrode 25 is made of a reflective metal material, it is not necessary to provide the reflection layer 28.

The partition wall 77 is formed between two pixel electrodes 25 that are formed next to each other. The partition wall 77 is formed as a result of patterning a resin layer that has a layer thickness of approximately 2.0 μm. As illustrated in the drawing, the patterned wall has slightly inclined sidewall surfaces. An opening area (no reference numeral is assigned thereto) that is formed as a result of the patterning, in other words, an area where the pixel electrode 25 is exposed, is the organic-EL-formation area where the organic EL element 29 is to be formed in a later layer-formation process. As explained earlier, the organic-EL-formation area where the organic EL element 29 is to be formed later constitutes an area where light produced in an organic EL layer is emitted, that is, the light-emitting area 101 (R, G, and B). In the structure of the organic EL apparatus 1 according to the present embodiment of the invention, the width of the partition wall 77, which is the X-direction dimension thereof shown in the drawing, differs depending on the colors of two light-emitting areas 101 that are partitioned by this partition wall 77. Specifically, each partition wall 77 (i.e., each part of the partition wall 77 when viewed as a whole) that separates the red light-emitting area 101R from the blue light-emitting area 101B, that is, each partition wall 77 that is formed between the red light-emitting area 101R and the blue light-emitting area 101B, has a relatively large width. Each partition wall 77 that separates the red light-emitting area 101R from the green light-emitting areas 101G has a relatively small width. Each partition wall 77 that separates the green light-emitting areas 101G from the blue light-emitting area 101E has also a relatively small width.

As defined earlier and illustrated in FIG. 2, the three types of the light-emitting areas 101, that is, one red light-emitting area 101R, one green light-emitting area 101G, and one blue light-emitting area 101B, constitute each unit. Accordingly, the width of each partition wall 77 that is formed between two units to separate one unit from the other is relatively large. The partition wall 77 that is formed between two light-emitting areas 101 of the same color arranged next to each other in the Y direction has also a relatively large width, which is the Y-direction dimension thereof.

A light-emitting function layer 26 is formed as the upper layer of the pixel electrode 25, which is exposed as a result of the patterning formation of the partition wall 77. The light-emitting function layer 26 is formed also on the partition wall 77. The light-emitting function layer 26 has a layered structure that includes a lamination of five layers. A hole injection layer, a hole transport layer, an organic EL layer, an electron transport layer, and an electron injection layer are laminated in the order of appearance herein viewed from the element substrate 10 in the upward direction. The organic EL layer of the organic EL apparatus 1 according to the present embodiment of the invention is a layer that emits white light. The organic EL layer is common to the aforementioned three types of the organic EL pixels 30 (R, G, and B).

Auxiliary cathode wiring (the second auxiliary cathode wiring 22 is shown in FIG. 3) is formed over the partition wall 77 having a larger width. The light-emitting function layer 26 is sandwiched between the auxiliary cathode wiring and the partition wall 77 having a larger width. In the following description of this specification, the second auxiliary cathode wiring 22 and a first auxiliary cathode wiring 21 described later (refer to FIG. 4) are collectively referred to as "auxiliary cathode wiring" without any reference numeral.

The material of the auxiliary cathode wiring has to have low resistance. The auxiliary cathode wiring of the organic EL apparatus 1 according to the present embodiment of the invention is made of Al or the like. Since it is preferable that the auxiliary cathode wiring should have a function of suppressing outside-light reflection, a layer that is made of a low reflection material such as Cr (chromium) or the like may be formed as the upper layer on the Al layer. The auxiliary cathode wiring is formed over the partition walls 77 that demarcate the light-emitting areas 101 arranged next to one another for area separation. The auxiliary cathode wiring is not formed inside the light-emitting area 101. Therefore, it is not necessary to use a transparent material for the formation of the partition walls 77. In addition, it is possible to form the partition wall 77 with a sufficient layer thickness so as to achieve low resistance.

The cathode 27 as an example of the second electrode according to an aspect of the invention is formed on the upper surface of the light-emitting function layer 26 and over the upper surface of the light-emitting function layer 26 on which the auxiliary cathode wiring is formed. Since the organic EL apparatus 1 is a top-emission type organic EL apparatus, the cathode 27 is required to have either transparent property or transflective property as well as electrically conductive property. In addition, the cathode 27 has to be made of a material that has a lower work coefficient than that of the material of the pixel electrode 25. Therefore, it is preferable that the cathode 27 should be made of Al (aluminum), MgAg (magnesium silver) alloy, or the like with a layer thickness of several nanometers (nm) to more than ten nanometers.

The cathode 27 is a common electrode. The cathode 27 is formed in the entire display area 100 over the element substrate 10. Therefore, a laminated body that is made up of the pixel electrode 25, the light-emitting function layer 26, and the cathode 27 is formed in each area surrounded by the partition walls 77. The laminated body constitutes the organic EL element 29. The voltage level of the cathode 27 is zero throughout the entire display area 100 (refer to FIG. 1). For this reason, when a voltage is applied to the pixel electrode 25, an electric current corresponding to the applied voltage flows in the light-emitting function layer 26. Then, the light-emitting function layer 26 emits light in accordance with the amount of the current. The cathode 27 is formed as the upper layer on the light-emitting function layer 26. In addition, the cathode 27 is formed as the upper layer on the auxiliary cathode wiring where the partition wall 77 having a larger width is formed. Therefore, the cathode 27 is electrically connected to the auxiliary cathode wiring. Thus, the cathode 27 can be regarded to have a larger layer thickness at each part of the partition wall 77 viewed as a whole that has a larger width, resulting in lower resistance.

Figure 4:
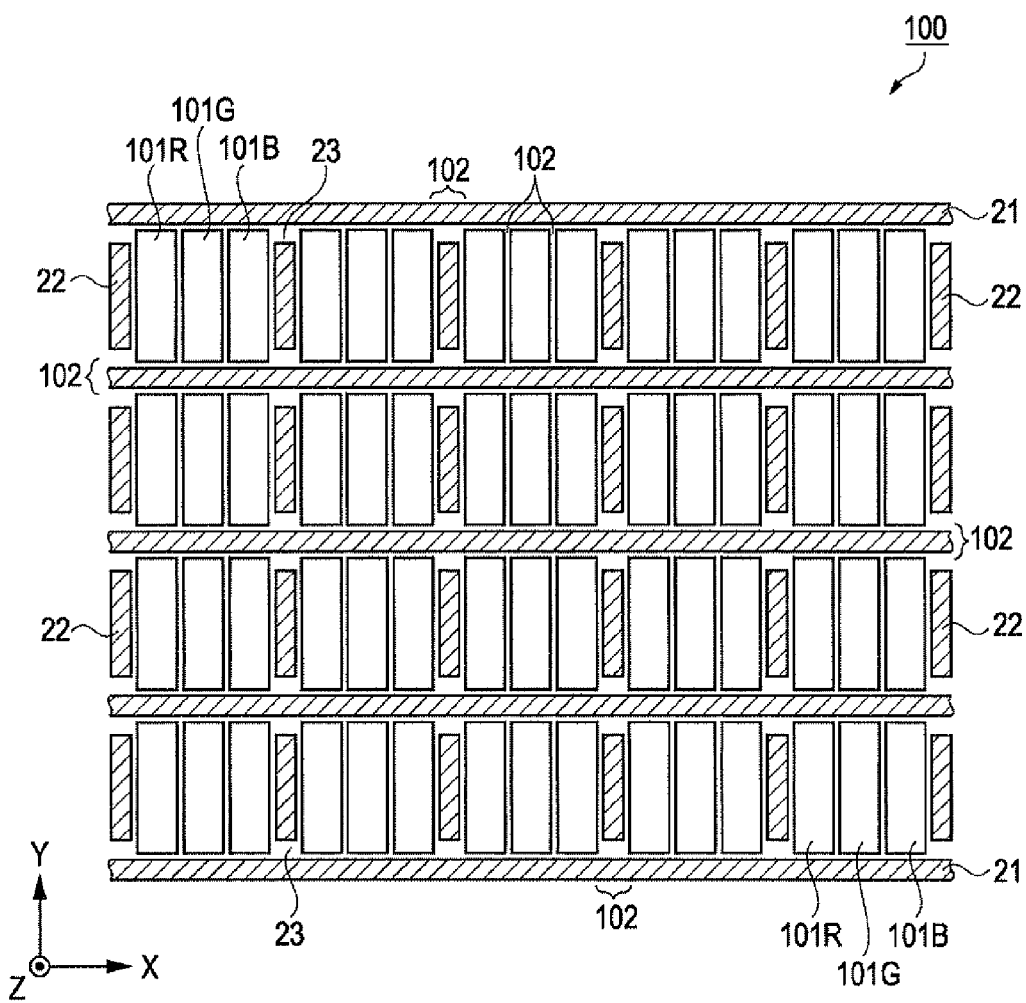
FIG. 4 is a plan view that schematically illustrates an example of the layout of auxiliary cathode wiring of an organic EL apparatus according to the first embodiment of the invention.

An electric current that flows in the light-emitting function layer 26 causes a voltage drop, which results in a decrease in voltage applied between the pixel electrode 25 and the cathode 27. The phenomenon of the voltage decrease is especially conspicuous at and near the center of the display area 100. The auxiliary cathode wiring has a function of practically increasing layer thickness at each area where the transparency of the cathode 27 is not required so as to achieve low resistance. By this means, the phenomenon of the voltage decrease can be reduced. In the structure of the organic EL apparatus 1 according to the present embodiment of the invention, the auxiliary cathode wiring extends in both the vertical direction and the horizontal direction inside the display area 100. That is, the auxiliary cathode wiring is formed along both the X direction, which is an example of a first direction according to an aspect of the invention, and the Y direction, which is an example of a second direction according to an aspect of the invention. An example of the layout of the auxiliary cathode wiring according to the present embodiment of the invention is illustrated in FIG. 4. A more detailed explanation of the layout illustrated in FIG. 4 will be given later.

The auxiliary cathode wiring of the organic EL apparatus 1 according to the present embodiment of the invention is formed at a layer between the light-emitting function layer 26 and the cathode 27 over the partition wall 77. Notwithstanding the foregoing, however, the auxiliary cathode wiring may be formed not between the light-emitting function layer 26 and the cathode 27 but between the cathode 27 and a passivation layer 85, which will be explained later. Electrical continuity between the auxiliary cathode wiring and the cathode 27 can be ensured as long as one of the auxiliary cathode wiring and the cathode 27 is formed directly on the other. Therefore, regardless of whether the auxiliary cathode wiring is formed before the formation of the cathode 27 or the cathode 27 is formed before the formation of the auxiliary cathode wiring, advantageous effects of the invention can be produced.

The passivation layer 85 is formed as the upper layer on the cathode 27 for the purpose of protecting the organic EL elements 29 and the like. After the formation of the passivation layer 85, the element substrate 10 is bonded to the counter substrate 11 by means of the adhesive layer 78 and the peripheral sealant 13 (refer to FIG. 2), which are sandwiched between the element substrate 10 and the counter substrate 11. A color filter layer 76 is formed on the element-substrate-side surface of the counter substrate 11, which faces toward the element substrate 10. As explained earlier, the circular light polarization plate 88 is provided on the other surface of the counter substrate 11 for the purpose of suppressing outside-light reflection. The color filter layer 76 is made up of three types of the color filter 75 and a black matrix 75K. The three types of the color filter 75 are: a red color filter 75R, a green color filter 75G, and a blue color filter 75B. The black matrix 75K is formed between each two types of the color filter 75. Light produced by each organic EL element 29 is colored into the corresponding one of the three primary colors by the color filter 75. The light exits at the counter-substrate (11) side as the emitted light 48.

As explained earlier, the formation area of the black matrix 75K is the separation area 102. The area at which the color filter 75 (R, G, and B) is formed is the light-emitting area 101. In addition, the separation area 102 is the area where the partition walls 77 are formed. The light-emitting area 101 is the area where the organic EL elements 29 are formed. As explained above, the auxiliary cathode wiring is formed over the partition wall 77. Therefore, it is not obstructive to the emission of light 48.

FIG. 4 is a plan view that schematically illustrates an example of the layout of auxiliary cathode wiring in the display area 100 of the organic EL apparatus 1 according to the first embodiment of the invention. As explained earlier, the three types (three colors) of the light-emitting areas 101 (R, G, and B) constitute each unit. In addition, as explained earlier, each area between two units of the light-emitting areas 101 arranged next to each other is a large-width part of the separation area 102. The first auxiliary cathode wiring 21 and the second auxiliary cathode wiring 22 are formed in the separation area 102. The first auxiliary cathode wiring 21 extends in the X direction, that is, an example of the first direction. The second auxiliary cathode wiring 22 extends in the Y direction, that is, an example of the second direction. Since each light-emitting area 101 has a rectangular shape, the extending direction of the first auxiliary cathode wiring 21 is substantially perpendicular to the extending direction of the second auxiliary cathode wiring 22. The first auxiliary cathode wiring 21 extends inside the display area 100 as continuous lines without any break.

On the other hand, the second auxiliary cathode wiring 22 extends as broken lines. The first auxiliary cathode wiring 21 divides the second auxiliary cathode wiring 22 at each "intersection" of the first auxiliary cathode wiring 21, which extends in the X direction, and the second auxiliary cathode wiring 22, which extends in the Y direction. That is, the second auxiliary cathode wiring 22 is made up of a plurality of elongated rectangular patterns arrayed in the Y direction. The Y-direction dimension of the elongated rectangular pattern is roughly equal to the Y-direction dimension of the light-emitting area 101. Therefore, although the first auxiliary cathode wiring 21 and the second auxiliary cathode wiring 22 are formed over the partition wall 77, which is formed in a grid pattern, the first auxiliary cathode wiring 21 and the second auxiliary cathode wiring 22 are separated from each other in a plan view. In other words, although the first auxiliary cathode wiring 21 and the second auxiliary cathode wiring 22 are formed on the same plane, they are separated from each other in a plan view. A gap 23 is formed between the first auxiliary cathode wiring 21 and the second auxiliary cathode wiring 22.

Despite the fact that the second auxiliary cathode wiring 22 is formed as a plurality of rectangular patterns separated from one another, that is, collection of rectangular patterns independent of one another, the second auxiliary cathode wiring 22 can reduce the surface resistance of the cathode 27 in the Y direction. As explained earlier, the cathode 27 is formed in the entire display area 100. For this reason, even though the patterns of the second auxiliary cathode wiring 22 are independent of one another, they are electrically connected to one another via the cathode 27. In like manner, the first auxiliary cathode wiring 21 and the second auxiliary cathode wiring 22 are electrically connected to each other via the cathode 27.

The area connected via the cathode 27, that is, the area where the first auxiliary cathode wiring 21 and the second auxiliary cathode wiring 22 are not formed in a plan view, has a slightly higher resistance (surface resistance) value. However, since such an area occupies a small part only, the structure of the cathode 27 of the organic EL apparatus 1 according to the present embodiment of the invention is equivalent to a structure that is made up of a thin film part that is formed in the entire display area 100 and a thick film part that is formed in a grid pattern to overlap the partition wall 77. Therefore, a cathode current (e.g., cathode current) applied at the time of the formation of an image in the display area 100 flows in the X direction and the Y direction almost uniformly, resulting in a substantial decrease in the surface resistance of the cathode 27. Thus, the organic EL apparatus 1 according to the present embodiment of the invention can reduce a voltage drop at and near the center of the display area 100 and suppress degradation in display quality (e.g., decrease in luminance) at and near the center thereof.

As explained below, the first auxiliary cathode wiring 21 and the second auxiliary cathode wiring 22 can be formed concurrently through the same process as the process of the formation of related-art auxiliary cathode wiring that extends either in the X direction or in the Y direction. Therefore, the organic EL apparatus 1 according to the present embodiment of the invention is capable of displaying an image in high quality while suppressing degradation in display quality at and near the center of the display area 100.

Second Embodiment

Figure 5:
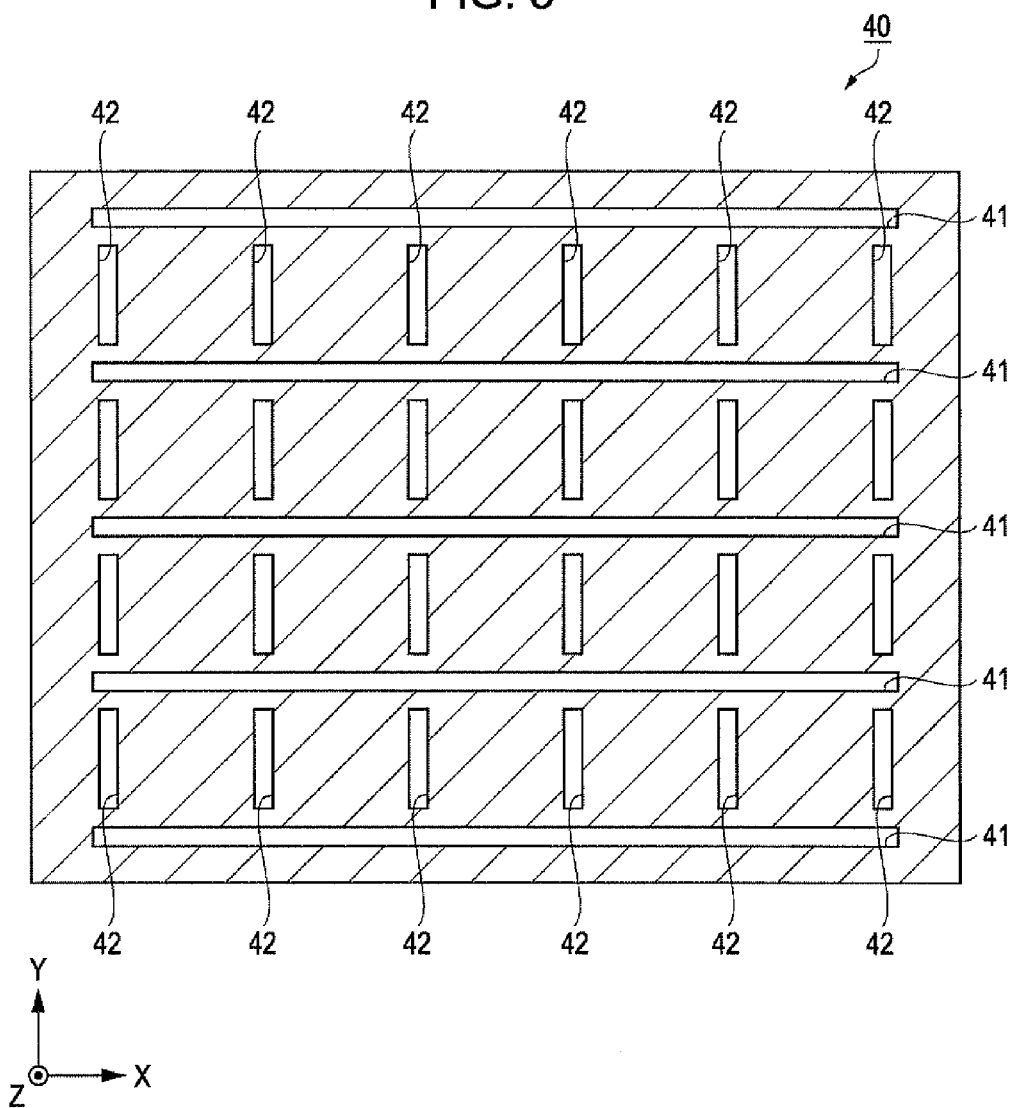
FIG. 5 is a plan view that schematically illustrates an example of the structure of a deposition mask according to an exemplary embodiment of the invention.

Next, a method of concurrently forming the first auxiliary cathode wiring 21 and the second auxiliary cathode wiring 22 is explained below as a second embodiment of the invention. FIG. 5 is a plan view that schematically illustrates an example of the structure of a deposition mask 40 that is used for the formation of auxiliary cathode wiring according to an exemplary embodiment of the invention. The deposition mask 40 is a plate member that has a first opening 41 and a second opening 42. The first opening 41 is formed at predetermined areas corresponding to the areas of the first auxiliary cathode wiring 21. The second opening 42 is formed at predetermined areas corresponding to the areas of the second auxiliary cathode wiring 22.

The first opening 41 extends in the X direction as continuous lines without any break. The second opening 42 is formed as rectangular patterns that are elongated in the Y direction. The plural patterns of the second opening 42 are arrayed next to one another in the Y direction with spaces left therebetween. Because the spaces are left, there is no area part that is completely surrounded by the openings. Therefore, the deposition mask 40 constitutes a single plate member though it has two types of opening (collective designation that combines the first opening 41 and the second opening 42) whose extending directions are orthogonal to each other.

Figure 6:
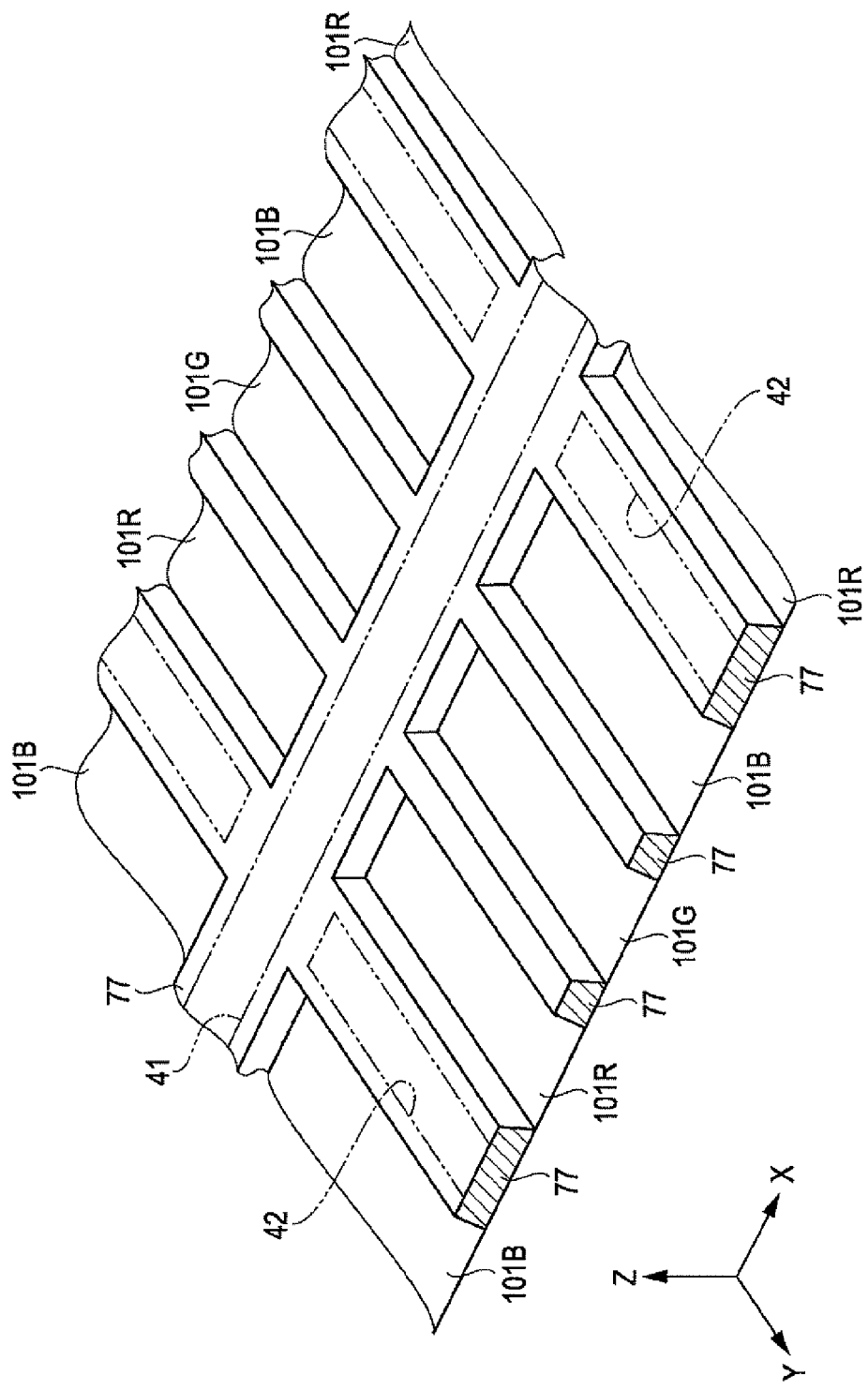
FIG. 6 is a perspective view that schematically illustrates an example of the positional relationship between the openings of the deposition mask and partition walls according to an exemplary embodiment of the invention.

FIG. 6 is a perspective view that schematically illustrates an example of the positional relationship between the openings of the deposition mask 40 and the partition walls 77 during the formation of auxiliary cathode wiring according to the present embodiment of the invention. Areas surrounded by two-dot chain lines illustrated on the partition walls 77 are areas where the openings are located. The deposition mask 40 is placed in contact with the partition wall 77 over the element substrate 10 (refer to FIG. 3) in such a manner that the first opening 41 is positioned on the partition wall 77 that extends in the X direction and that the second opening 42 is positioned on the partition wall 77 formed between the red light-emitting area 101R and the blue light-emitting area 101B, which has a relatively large width. As illustrated in the drawing, the width of the opening is slightly smaller than that of the partition wall 77 so as to avoid the sedimentation of Al particles 45 (refer to FIG. 7), which will be explained later, on the light-emitting area 101.

Figure 7A:
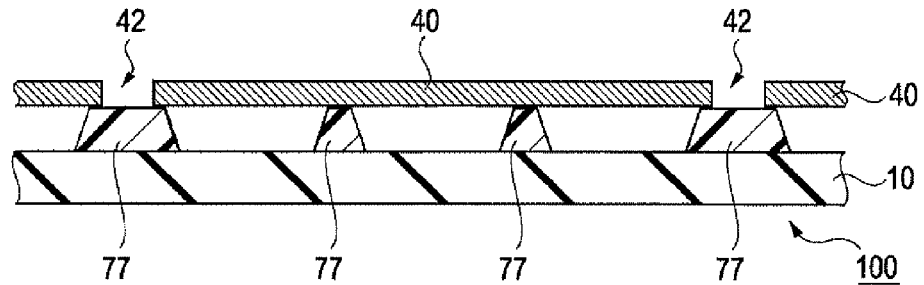
FIGS. 7A, 7B, 7C, and 7D are a set of sectional views that schematically illustrates an example of processes of a method for forming auxiliary cathode wiring according to an exemplary embodiment of the invention.

FIGS. 7A, 7B, 7C, and 7D are a set of sectional views that schematically illustrates an example of processes of a method for forming auxiliary cathode wiring according to an exemplary embodiment of the invention. The method is explained below in the order of processes. As a first step, after the formation of the partition wall 77, the deposition mask 40 is placed in contact with the partition wall 77 over the element substrate 10 as illustrated in FIG. 7A. The deposition mask 40 is placed in such a manner that the opening is positioned on the partition wall 77 as explained above with reference to FIG. 6. FIG. 7 is a sectional view that is perpendicular to the Z direction. Therefore, the second opening 42 is shown on the partition wall 77. Each area between the partition walls 77 is the light-emitting area 101.

Figure 7B:
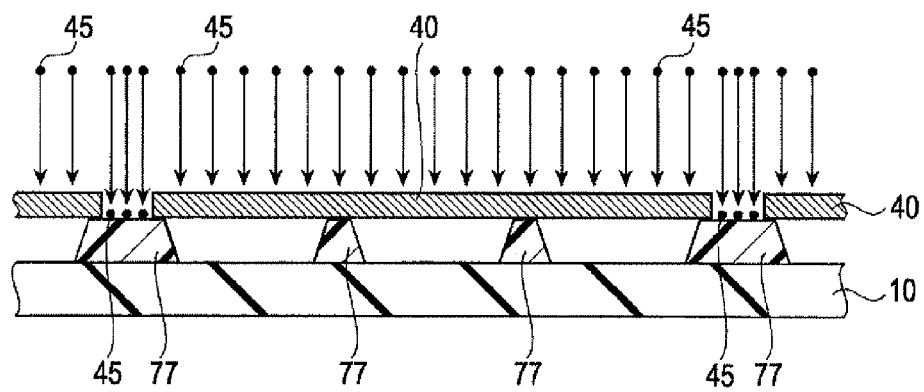

Next, a deposition source that is not illustrated in the drawing discharges the Al particles 45 toward the element substrate 10 as illustrated in FIG. 7B. The Al particles 45 are an example of conductive material particles according to an aspect of the invention. The Al particles 45 deposit on the partition wall 77 at each area where the opening (the second opening 42 in FIG. 7B) is located.

Figure 7C:
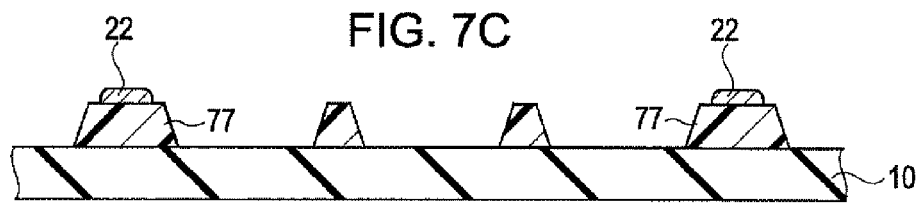

Next, as illustrated in FIG. 7C, the deposition mask 40 is removed from the element substrate 10. Auxiliary cathode wiring (21 and 22) that is made of Al is formed at each area where the opening was located on the partition wall 77 before the removal of the deposition mask 40. That is, the auxiliary cathode wiring is formed at the areas surrounded by the two-dot chain lines in FIG. 6. As explained earlier, the auxiliary cathode wiring may be formed as a lamination of two or more layers made of different materials. In such a case, the lamination process illustrated in FIG. 7B is repeated with the same deposition mask 40 remaining in contact with the partition wall 77, that is, before the removal thereof.

Figure 7D:
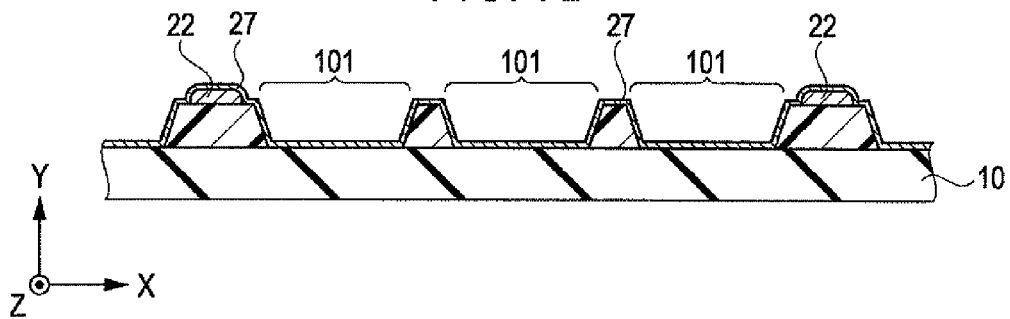

Next, as illustrated in FIG. 7D, the cathode 27 is formed on the entire surface of the element substrate 10 by, for example, a sputtering method. A preferable material of the cathode 27 is Al, MgAg alloy, or the like as explained earlier. Since the auxiliary cathode wiring is a laminated body of conductive material particles, the cathode 27 is electrically connected to the auxiliary cathode wiring. Through the processes explained above, a layered structure (i.e., laminated body) that is made up of the cathode 27, which is formed in the entire display area 100, and the auxiliary cathode wiring, which is formed substantially in a grid pattern, can be formed. The laminated body is substantially equivalent to a structure that includes a thin film part that corresponds to the light-emitting area 101 (that is, the area where the organic EL elements 29 are formed) and a thick film part that is formed in a grid pattern corresponding to the partition wall 77. The laminated body makes it possible to reduce the surface resistance of the cathode 27 both in the X direction and in the Y direction without obstructing the propagation of the light 48 (refer to FIG. 3) emitted from the light-emitting area 101.

As explained earlier, the sequential order of the formation of the auxiliary cathode wiring and the formation of the cathode 27 may be reversed. That is, in the process sectional view explained above, the cathode 27 may be formed first on and over the entire surface of the element substrate 10 as illustrated in FIG. 7D, which is followed by the formation of the auxiliary cathode wiring through a series of steps illustrated in FIGS. 7A to 7C. Regardless of whether the auxiliary cathode wiring is formed before the formation of the cathode 27 or the cathode 27 is formed before the formation of the auxiliary cathode wiring, the auxiliary cathode wiring and the cathode 27 are electrically connected to each other. Therefore, the advantageous effects explained above are produced. As examples of an alternative formation method other than the deposition method explained above, the auxiliary cathode wiring may be formed by means of an ion plating method, a sputtering method, or an ion beam method. With any of the alternative methods, it is possible to concurrently form the first auxiliary cathode wiring 21 and the second auxiliary cathode wiring 22 with the use of the same mask as the deposition mask 40.

Third Embodiment

Figure 8:
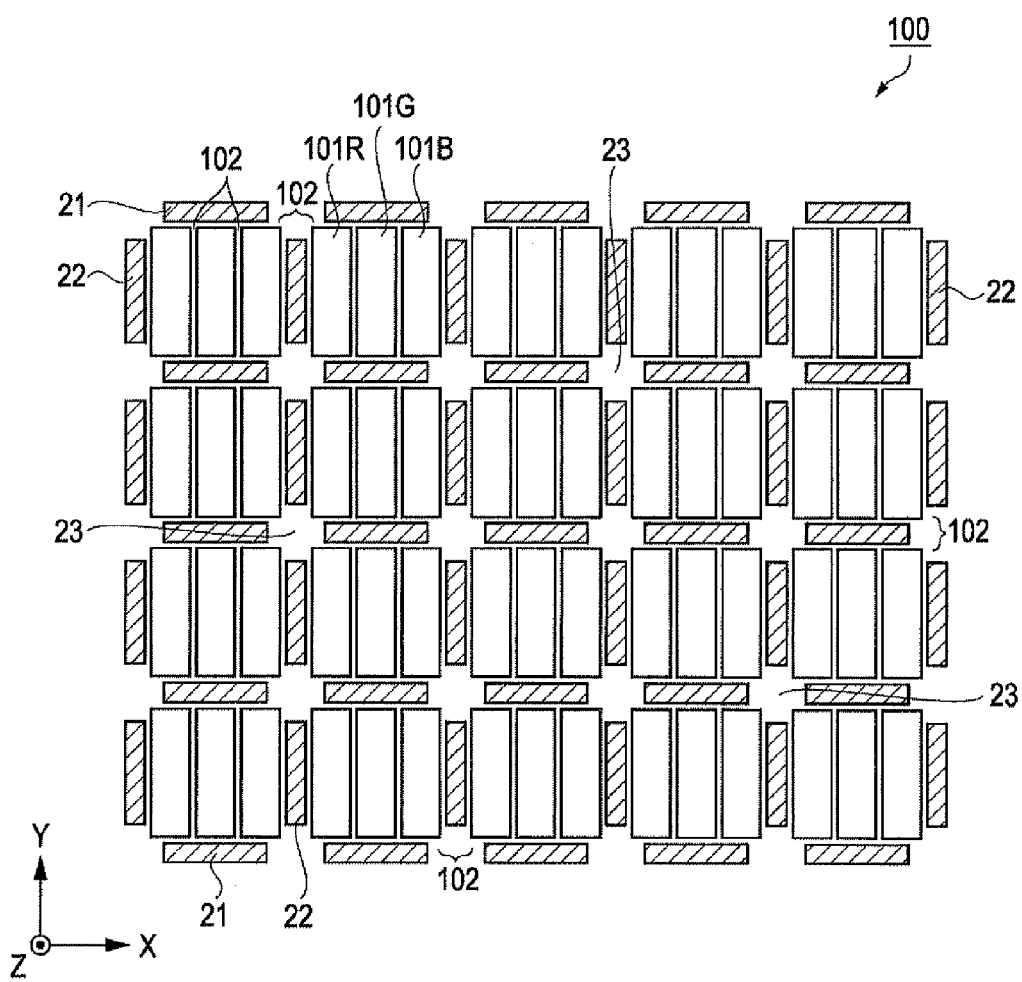
FIG. 8 is a plan view that schematically illustrates an example of the layout of auxiliary cathode wiring according to a third embodiment of the invention.

FIG. 8 is a plan view that schematically illustrates an example of the layout of auxiliary cathode wiring of an organic EL apparatus according to a third embodiment of the invention. An organic EL apparatus according to the present embodiment of the invention has the same configuration as that of the organic EL apparatus 1 according to the first embodiment of the invention except that the pattern (e.g., layout) of the auxiliary cathode wiring differs from that of the foregoing embodiment. Therefore, the pattern of the auxiliary cathode wiring only is shown. Drawings that correspond to FIGS. 1 to 3 are omitted.

The feature of auxiliary cathode wiring of an organic EL apparatus according to the present embodiment of the invention lies in that both the first auxiliary cathode wiring 21, which extends in the X direction, and the second auxiliary cathode wiring 22, which extends in the Y direction, have the gaps 23.

As in the array pattern of the light-emitting areas 101 of the organic EL apparatus 1 according to the first embodiment of the invention, the three types of the light-emitting area 101 (R, G, and B) in an organic EL apparatus according to the present embodiment of the invention constitute each unit. In addition, auxiliary cathode wiring is formed between units in the separation area 102. If each unit is regarded as a rectangular pattern, the auxiliary cathode wiring of an organic EL apparatus according to the present embodiment of the invention is patterned as follows: the first auxiliary cathode wiring 21 is formed as elongated (rectangular) patterns each of which has an X-dimension length that is the same as, or slightly shorter than, the length of an X-directional side of the unit whereas the second auxiliary cathode wiring 22 is formed as elongated patterns each of which has a Y-dimension length that is the same as, or slightly shorter than, the length of a Y-directional side of the unit. Therefore, an area at and near the intersection of the extending directions of the auxiliary cathode wiring constitutes the common gap 23.

As explained earlier, the cathode 27 (refer to FIG. 3) is formed in the entire display area 100 including the area where the auxiliary cathode wiring is formed. Therefore, though the first auxiliary cathode wiring 21 has the gaps 23, it is possible to reduce the resistance of the cathode in the X direction. Therefore, the auxiliary cathode wiring of the organic EL apparatus according to the present embodiment of the invention produces an advantageous effect that is the same as or similar to that of the auxiliary cathode wiring of the organic EL apparatus 1 according to the first embodiment of the invention. That is, it is possible to reduce a voltage drop at and near the center of the display area 100 and suppress degradation in display quality at and near the center thereof.

In addition, the auxiliary cathode wiring of the organic EL apparatus according to the present embodiment of the invention has an advantage in that the strength of the deposition mask 40 used for the formation thereof can be increased. Since the first auxiliary cathode wiring 21 of the organic EL apparatus according to the present embodiment of the invention has the gaps 23, the first opening 41 (refer to FIG. 5) of the deposition mask 40 used for the formation thereof is divided in a plurality of rectangular (i.e., elongated) patterns. That is, it does not go throughout the entire display area 100. Therefore, the strength of the deposition mask 40 increases, which reduces a risk of deformation such as distortion and the like. For this reason, the deposition mask 40 can be placed in tighter contact with the partition wall 77 during the formation of the auxiliary cathode wiring, thereby improving precision in the patterning of the auxiliary cathode wiring. Taking advantage of such improved pattern precision, it is possible to form auxiliary cathode wiring that has a larger width (i.e., shorter-side dimension) in the same separation area 102. Thus, the surface resistance of the cathode 27 can be further reduced.

Fourth Embodiment

Figure 9:
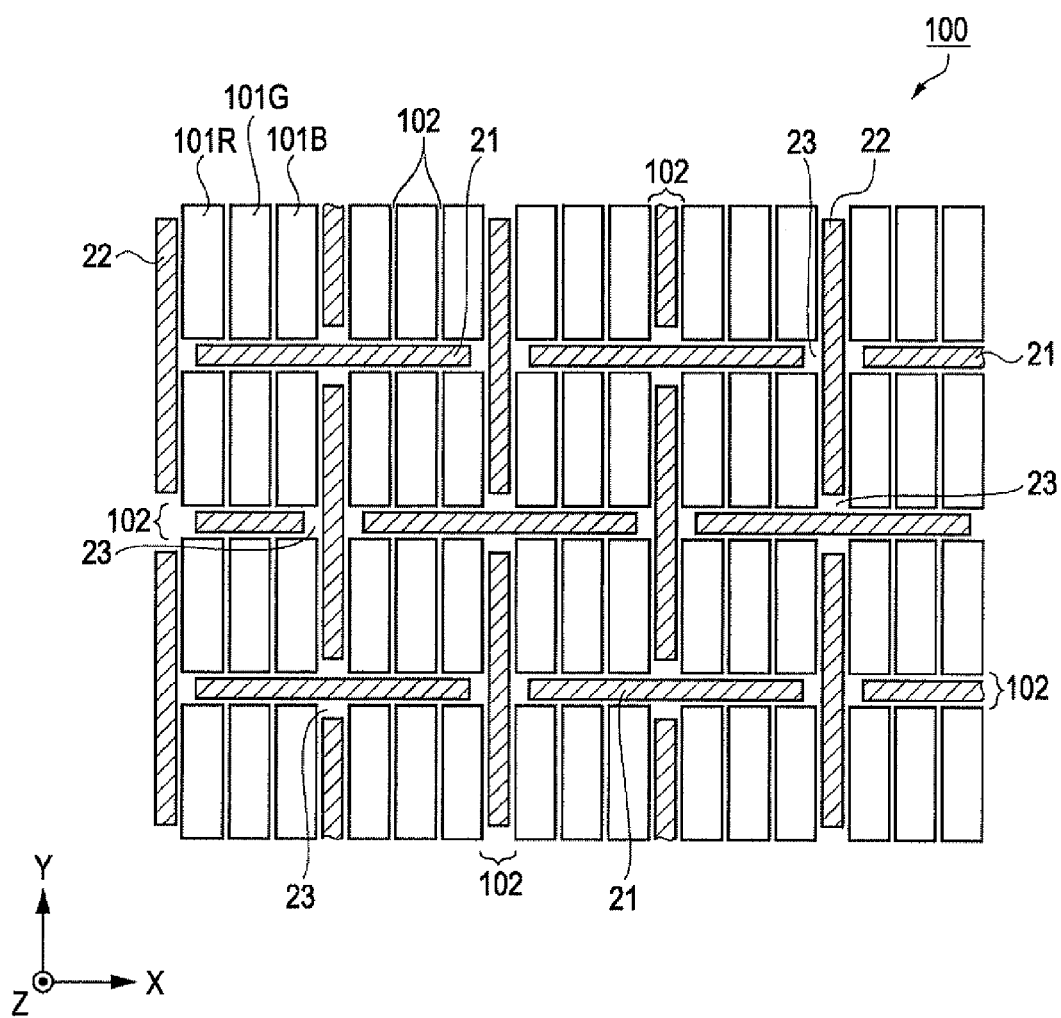
FIG. 9 is a plan view that schematically illustrates an example of the layout of auxiliary cathode wiring according to a fourth embodiment of the invention.

FIG. 9 is a plan view that schematically illustrates an example of the layout of auxiliary cathode wiring of an organic EL apparatus according to a fourth embodiment of the invention. An organic EL apparatus according to the present embodiment of the invention has, like the organic EL apparatus according to the third embodiment of the invention explained above, the same configuration as that of the organic EL apparatus 1 according to the first embodiment of the invention except that the pattern of the auxiliary cathode wiring differs from that of the foregoing embodiment. Therefore, the pattern of the auxiliary cathode wiring only is shown. Drawings that correspond to FIGS. 1 to 3 are omitted.

The features of auxiliary cathode wiring of an organic EL apparatus according to the present embodiment of the invention are as follows: both the first auxiliary cathode wiring 21 and the second auxiliary cathode wiring 22 have the gaps 23; in addition, one gap is formed for two units each of which is made up of the three types of the light-emitting area 101 (R, G, and B). In addition, both the first auxiliary cathode wiring 21 and the second auxiliary cathode wiring 22 are arranged in a staggered array inside the display area 100. Therefore, although the length of the long side of each of the first auxiliary cathode wiring 21 and the second auxiliary cathode wiring 22 is greater than the length of a side of the unit, there is no area part that is completely surrounded by the first auxiliary cathode wiring 21 and the second auxiliary cathode wiring 22. Thus, the auxiliary cathode wiring according to the present embodiment of the invention can be concurrently formed with the use of a single deposition mask 40.

The auxiliary cathode wiring of the organic EL apparatus according to the present embodiment of the invention has an advantage of further reducing the surface resistance of the cathode 27. The width (i.e., shorter-side dimension) of the auxiliary cathode wiring according to the present embodiment of the invention is the same as that of the auxiliary cathode wiring according to the third embodiment of the invention explained above. In addition, the density of the gaps 23 arranged in the display area 100 is approximately one half. For this reason, greater reduction of a voltage drop is achieved at the gaps 23. Thus, the organic EL apparatus according to the present embodiment of the invention makes it possible to further reduce a voltage drop at and near the center of the display area 100 and further suppress degradation in display quality at and near the center thereof.

Fifth Embodiment

Figure 10:
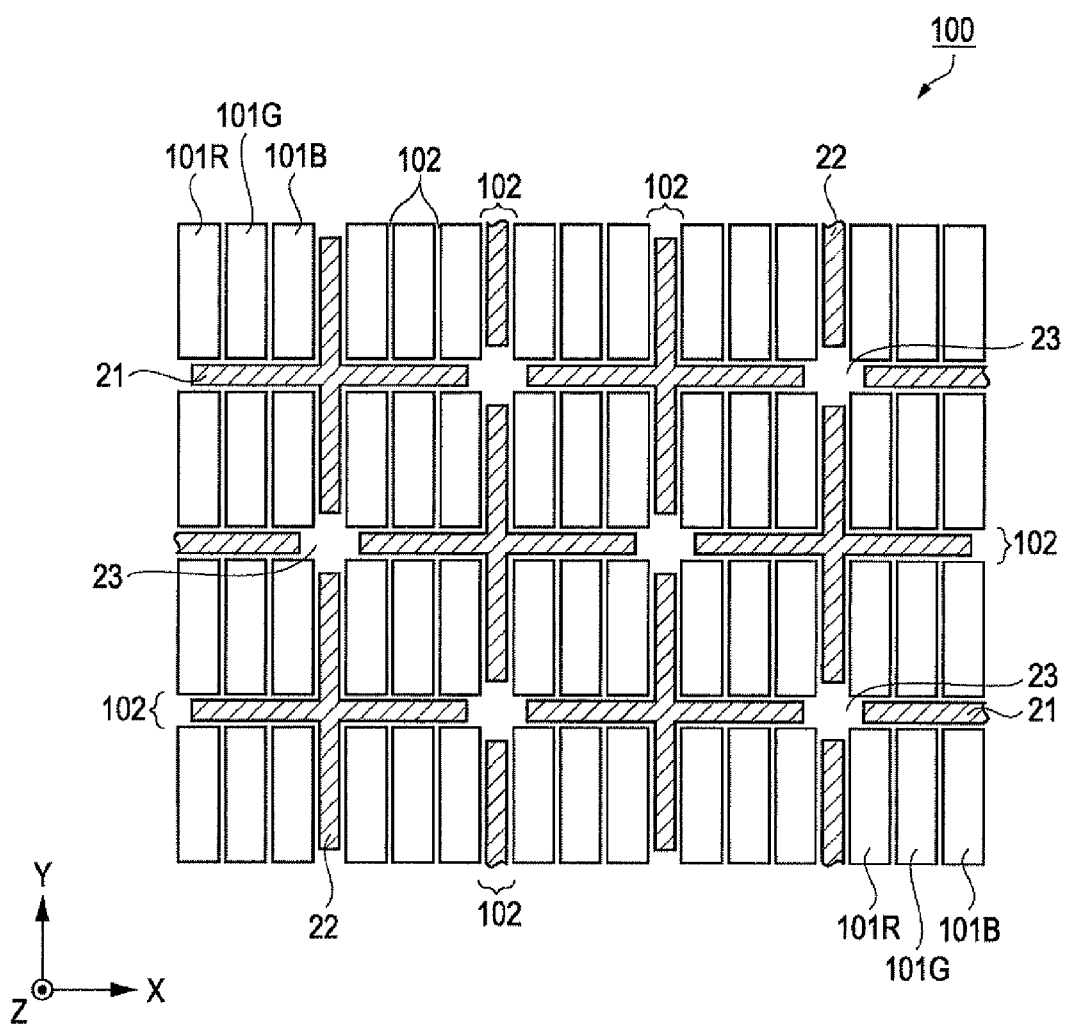
FIG. 10 is a plan view that schematically illustrates an example of the layout of auxiliary cathode wiring according to a fifth embodiment of the invention.

FIG. 10 is a plan view that schematically illustrates an example of the layout of auxiliary cathode wiring of an organic EL apparatus according to a fifth embodiment of the invention. An organic EL apparatus according to the present embodiment of the invention has, like the organic EL apparatus according to the third embodiment of the invention explained earlier, the same configuration as that of the organic EL apparatus 1 according to the first embodiment of the invention except that the pattern of the auxiliary cathode wiring differs from that of the foregoing embodiment. Therefore, the pattern of the auxiliary cathode wiring only is shown. Drawings that correspond to FIGS. 1 to 3 are omitted.

Auxiliary cathode wiring of an organic EL apparatus according to the present embodiment of the invention has some features in common with the auxiliary cathode wiring according to the fourth embodiment of the invention explained above. Specifically, both the first auxiliary cathode wiring 21 and the second auxiliary cathode wiring 22 have the gaps 23 each of which is formed for two units. In addition, both the first auxiliary cathode wiring 21 and the second auxiliary cathode wiring 22 are arranged in a staggered array inside the display area 100. However, either the first auxiliary cathode wiring 21 or the second auxiliary cathode wiring 22 is shifted by shift amount corresponding to one unit. For this reason, an intersection of the first auxiliary cathode wiring 21 and the second auxiliary cathode wiring 22 is formed for every other unit. That is, one intersection is formed for two units in this array pattern.

The auxiliary cathode wiring according to the present embodiment of the invention has an advantage in terms of a greater margin of space in the formation of the gap 23. In the layout of the auxiliary cathode wiring according to the present embodiment of the invention, each gap 23 is formed at a crossroad area toward which the auxiliary cathode wiring extends in the X direction and the Y direction. Even when one of four patterns of the auxiliary cathode wiring protrudes to some extent, the area of the gap 23 is still left, which means that the gap 23 can be formed reliably. In contrast, in a layout in which one of the first auxiliary cathode wiring 21 and the second auxiliary cathode wiring 22 extends toward a long side of the other in a direction perpendicular thereto while leaving a very small clearance between the end of the extending one and the long side of the other, and vice versa, even a slight dimensional error in the extending (i.e., long-side) direction of the one could affect the formation of the gap 23, which means that the gap 23 might not be formed. The auxiliary cathode wiring according to the present embodiment of the invention has an advantageous feature in that, since the gap 23 is formed with a greater margin of space, the formation of the deposition mask 40 is easier. In addition, the gap 23 can be formed reliably even when the contact between the deposition mask 40 and the partition wall 77 is imperfect to some degree.

Electronic Apparatus

Figure 13:
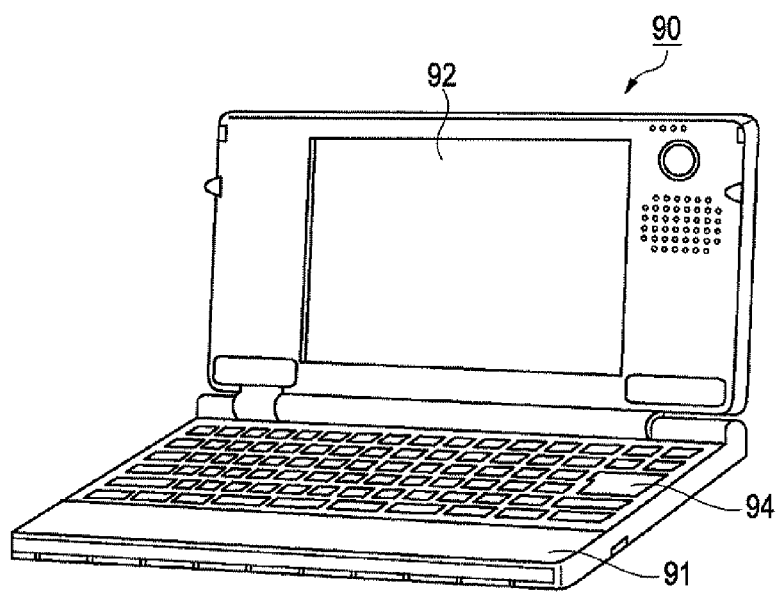
FIG. 13 is a perspective view that schematically illustrates the appearance of a mobile personal computer, which is an example of an electronic apparatus.

Next, an example of an electronic apparatus to which any of the above organic EL apparatuses according to the first, third, fourth, and fifth embodiments of the invention is applied is explained below. FIG. 13 is a perspective view that schematically illustrates the appearance of a mobile personal computer, which is an example of an electronic apparatus. A personal computer 90 is provided with a computer main assembly unit 91 and a display unit 92. The display unit 92 displays various images. A keyboard 94 and the like are provided on the main unit 91. Various kinds of information such as content inputted through the keyboard 94 are displayed on the display unit 92.

The organic EL apparatus 1 according to the first embodiment of the invention, or any of the organic EL apparatuses according to the third, fourth, and fifth embodiments of the invention, is built in the display unit 92. The display unit 92 performs display through the operation of the built-in organic EL apparatus. Provided with the first auxiliary cathode wiring 21 and the second auxiliary cathode wiring 22 that are substantially perpendicular to each other, the organic EL apparatus according to an exemplary embodiment of the invention can reduce a voltage drop at and near the center of the display area 100 (refer to FIG. 2). Therefore, the personal computer 90 is capable of displaying, on the display unit 92, images in high quality with a substantially reduced difference between display quality at the peripheral screen area and display quality at the center screen area.

Variation Example 1

Figure 11:
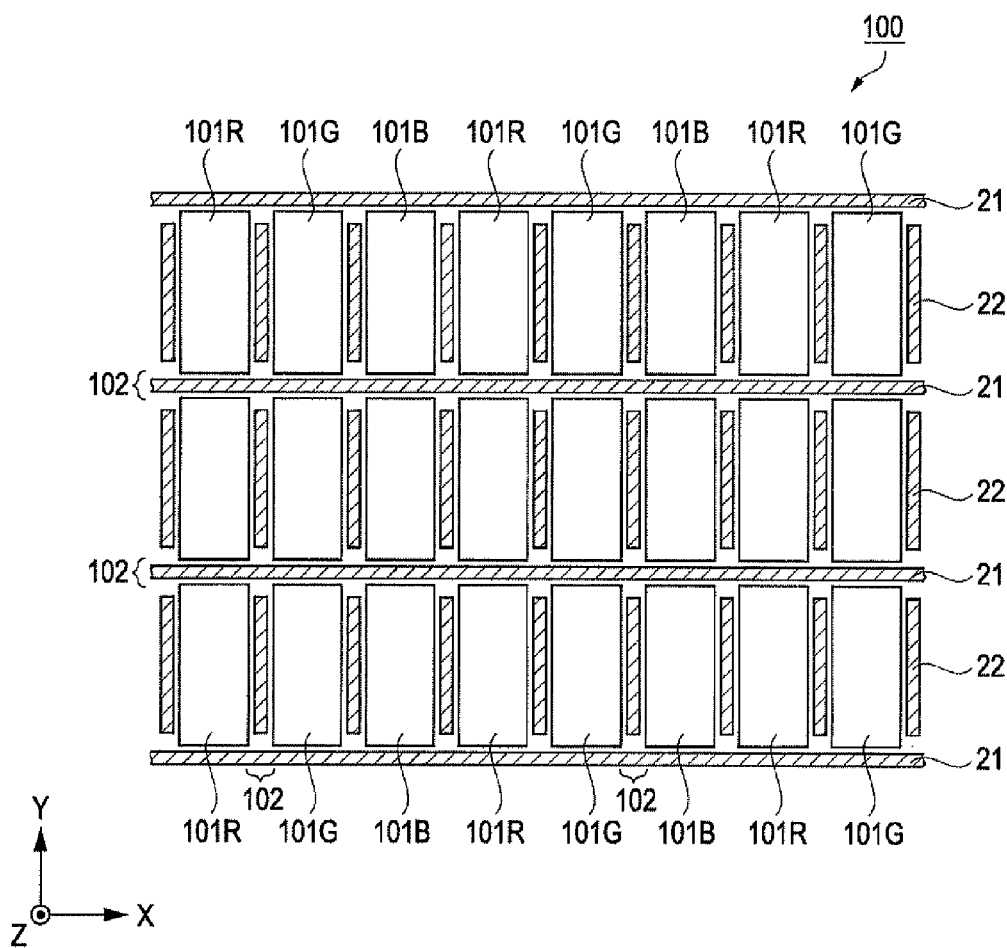
FIG. 11 is a plan view that schematically illustrates the layout of auxiliary cathode wiring according to a first variation example of the invention.

FIG. 11 is a plan view that schematically illustrates the layout of auxiliary cathode wiring of an organic EL apparatus according to a first variation example of the invention. Unlike the array pattern of the organic EL apparatus according to each of the foregoing embodiments of the invention, all light-emitting areas 101 (R, G, and B) of an organic EL apparatus according to the first variation example are arranged at regular intervals not only in the Y direction but also in the X direction. For this reason, the aforementioned unit that is made up of the three types of the light-emitting area 101 is not formed. Except for the above difference, the organic EL apparatus according to the first variation example has the same configuration as that of the organic EL apparatus according to each of the foregoing embodiments of the invention. The organic EL apparatus according to the first variation example is an active-matrix organic EL apparatus, which controls the emission of light from the individual light-emitting areas 101 independently of one another. In addition, the organic EL apparatus according to the first variation example is a top-emission organic EL apparatus, which emits the light 48 at the counter-substrate (11) side (refer to FIG. 3).

Since the light-emitting areas 101R, 101G, and 101E are arranged at regular intervals in the X direction, too, the second auxiliary cathode wiring 22 is formed each between the light-emitting areas 101R, 101G, and 101B as illustrated in the drawing. The first auxiliary cathode wiring 21 extends in the X direction as continuous lines without any gap 23 (i.e., break), which is the same as the pattern of the first auxiliary cathode wiring 21 of the organic EL apparatus 1 according to the first embodiment of the invention. In a type of an organic EL apparatus that requires the separation area 102 to be formed between all light-emitting areas adjacent to one another, the array pattern explained above is advantageous in terms of efficient use of the separation area 102, resulting in a substantial reduction in the surface resistance of the cathode 27.

Variation Example 2

Figure 12:
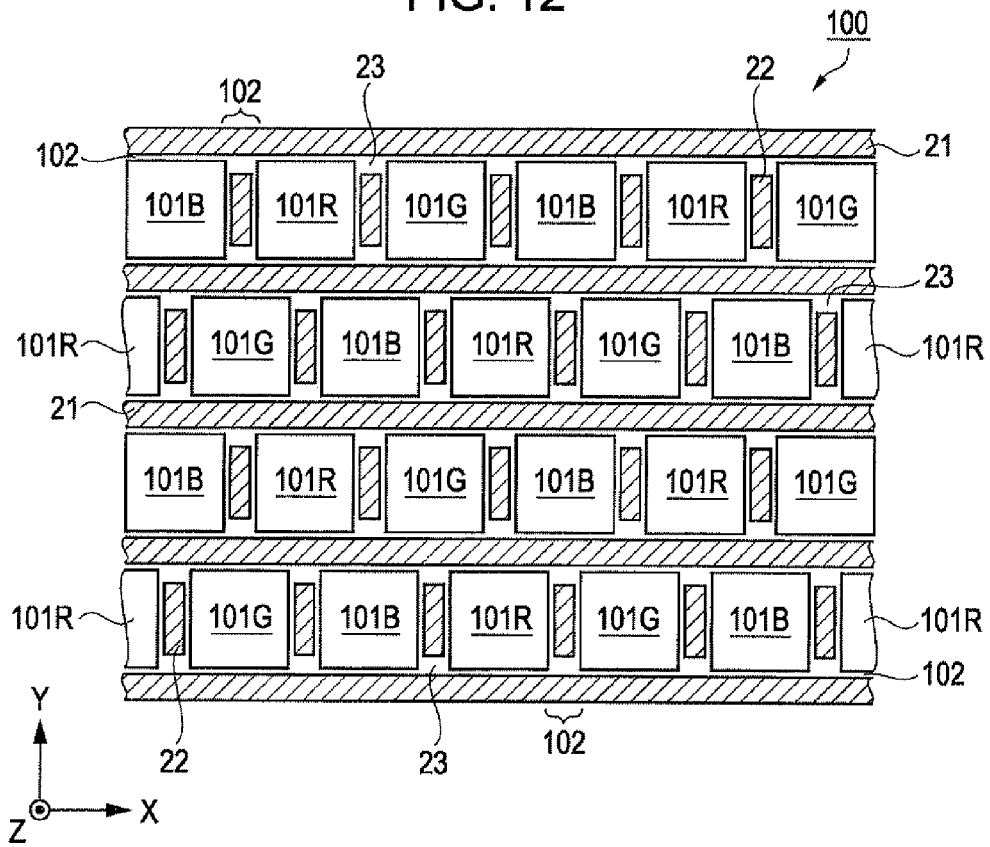
FIG. 12 is a plan view that schematically illustrates the layout of auxiliary cathode wiring according to a second variation example of the invention.

FIG. 12 is a plan view that schematically illustrates the layout of auxiliary cathode wiring of an organic EL apparatus according to a second variation example of the invention. Unlike the array pattern of the organic EL apparatus according to each of the foregoing embodiments of the invention, the light-emitting areas 101 (R, G, and B) of an organic EL apparatus according to the second variation example are arranged in a staggered array. Therefore, the separation area 102 that extends in the X direction is formed as lines whereas the separation area 102 that extends in the Y direction is formed in a staircase array pattern. Auxiliary cathode wiring, which is a combination of the first auxiliary cathode wiring 21 and the second auxiliary cathode wiring 22, is formed in accordance with the array pattern of the separation area 102. The first auxiliary cathode wiring 21 extends in the X direction as continuous lines without any gap 23. The second auxiliary cathode wiring 22 is a staggered array of a plurality of patterns each of which is elongated in the Y direction.

Because of the presence of the gaps 23, the organic EL apparatus according to the second variation example of the invention includes no area part that is completely surrounded by the first auxiliary cathode wiring 21 and the second auxiliary cathode wiring 22 as is the case with each of the foregoing embodiments of the invention. Therefore, the auxiliary cathode wiring according to the second variation example of the invention can be concurrently formed with the use of a single deposition mask 40. In addition, it is possible to substantially reduce the surface resistance of the cathode 27 (refer to FIG. 3).

Variation Example 3

The auxiliary cathode wiring of an organic EL apparatus according to each of the foregoing embodiments of the invention and each of the variation examples is formed inside the display area 100 with uniform density. Notwithstanding the foregoing, however, the density of the auxiliary cathode wiring and/or the density of the gaps 23 at and near the center of the display area 100 may be different from that of the peripheral area. For example, the auxiliary cathode wiring may be formed with higher density at and near the center of the display area 100. The gaps 23 may be formed with lower density at and near the center of the display area 100. By this means, it is possible to further reduce a voltage drop at and near the center of the display area 100 and further reduce a difference between display quality at the peripheral part of the display area 100 and display quality at the center part of the display area 100.

The entire disclosure of Japanese Patent Application No. 2008-327071, filed Dec. 24, 2008 is expressly incorporated by reference herein.

What is claimed is:

1. An electroluminescence apparatus comprising:
a plurality of electroluminescence elements each of which includes a first electrode, a second electrode that is provided opposite the first electrode, and a light-emitting function layer that is disposed between the first electrode and the second electrode;
a separation area that separates the plurality of electroluminescence elements arranged next to one another;
a display area in which the plurality of electroluminescence elements and the separation area are formed; and
a plurality of auxiliary wirings that are formed in the separation area, the auxiliary wirings being electrically connected to the second electrode, the auxiliary wirings including a first auxiliary wiring that extends in a first direction and a second auxiliary wiring that extends in a second direction, which is different from the first direction,
wherein the first auxiliary wiring and the second auxiliary wiring are disposed in a first layer, the second auxiliary wiring not contacting the first auxiliary wiring and separated from the first auxiliary wiring, and
wherein a gap is positioned between the first auxiliary wiring and the second auxiliary wiring, the gap includes a first gap and a second gap formed in the display area, and a dimension of the first gap is different from a dimension of the second gap.

2. The electroluminescence apparatus according to claim 1, wherein the first direction and the second direction is orthogonal, or substantially orthogonal, to each other.

3. An electronic apparatus that is provided with the electroluminescence apparatus according to claim 1.

4. An electroluminescence apparatus comprising:
a substrate;
a plurality of electroluminescence elements that are disposed above the substrate, each of the electroluminescence elements includes a first electrode, a second electrode opposed to the first electrode, and a light-emitting layer disposed between the first electrode and the second electrode; and
a plurality of auxiliary wirings that are electrically connected to the second electrode, the auxiliary wirings having a first auxiliary wiring extending in a first direction and a second auxiliary wiring extending in a second direction intersecting the first direction,
the electroluminescence elements include a first group of the electroluminescence elements having a first electroluminescence element, a second electroluminescence element, and a third electroluminescence element and a second group of the electroluminescence elements having a fourth electroluminescence element, a fifth electroluminescence element, and a sixth electroluminescence element, the first group of the electroluminescence elements and the second group of the electroluminescence elements extending in the first direction,
the first auxiliary wiring extending along at least one of the first group of the electroluminescence elements and the second group of the electroluminescence elements, and
the second auxiliary wiring disposed in an area positioned between the first group of the electroluminescence elements and the second group the electroluminescence elements, and
wherein a gap is positioned between the first auxiliary wiring and the second auxiliary wiring, the gap includes a first gap and a second gap, and a dimension of the first gap is different from a dimension of the second gap.

* * * * *